United States Patent
Park et al.

(10) Patent No.: US 8,732,558 B1
(45) Date of Patent: May 20, 2014

(54) MPE-FEC SYSTEM CAPABLE OF SELECTING AN FEC MODE, A FORWARD ERROR CORRECTING METHOD PERFORMED IN THE MPE-FEC SYSTEM, AND AN FEC MODE SELECTING METHOD PERFORMED IN THE MPE-FEC SYSTEM

(75) Inventors: Jae-hong Park, Suwon-si (KR); Ryan Kim, Yongin-si (KR); Tack-won Kwon, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1707 days.

(21) Appl. No.: 11/739,938

(22) Filed: Apr. 25, 2007

(51) Int. Cl.
*H03M 13/00* (2006.01)
*H03M 13/37* (2006.01)
*G06F 11/07* (2006.01)
*H03M 13/15* (2006.01)

(52) U.S. Cl.
CPC ......... *H03M 13/3707* (2013.01); *G06F 11/076* (2013.01); *G06F 11/0772* (2013.01); *H03M 13/3715* (2013.01); *H03M 13/154* (2013.01); *H03M 13/6541* (2013.01)
USPC .......................................... 714/774; 714/780

(58) Field of Classification Search
CPC ...................... H03M 13/3707; H03M 13/3715; H03M 13/154; H03M 13/6541; G06F 11/076; G06F 11/0772
USPC ................................................. 714/774, 780
See application file for complete search history.

(56) References Cited

U.S. PATENT DOCUMENTS

| | | | | |
|---|---|---|---|---|
| 4,107,650 A | * | 8/1978 | Luke et al. | 714/762 |
| 4,653,052 A | * | 3/1987 | Doi et al. | 714/755 |
| 4,835,772 A | * | 5/1989 | Peile et al. | 714/762 |
| 5,446,743 A | * | 8/1995 | Zook | 714/784 |
| 5,608,740 A | * | 3/1997 | Watanabe | 714/755 |
| 5,774,648 A | * | 6/1998 | Kao et al. | 714/48 |
| 6,081,919 A | * | 6/2000 | Fujiwara et al. | 714/755 |
| 6,240,538 B1 | * | 5/2001 | Dent et al. | 714/762 |
| 6,516,436 B1 | * | 2/2003 | Dave et al. | 714/753 |
| 6,553,536 B1 | | 4/2003 | Hassner et al. | |
| 6,639,865 B2 | * | 10/2003 | Kwon | 365/230.03 |
| 6,704,902 B1 | | 3/2004 | Shinbashi et al. | |

(Continued)

FOREIGN PATENT DOCUMENTS

JP 2004-215240 7/2004

OTHER PUBLICATIONS

Stephen B. Wicker, Error Control Systems for Digital Communication and Storage, Pretice-Hall 1996, pp. 202-237.*

*Primary Examiner* — Joseph D Torres
(74) *Attorney, Agent, or Firm* — F. Chau & Associates, LLC

(57) ABSTRACT

A forward error correcting method in a multi protocol encapsulation-forward error correction (MPE-FEC) system, in which FEC modes are selected. The forward error correcting method includes comparing a number of received ERASUREs with a number of reference ERASUREs, selecting an ERASURE ONLY mode in which FEC is performed based on information about locations and sizes of errors, when the number of received ERASUREs is less than or equal to the number of reference ERASUREs, wherein the ERASURE ONLY mode is an FEC mode, selecting a NORMAL RS mode in which FEC is performed with respect to errors whose locations and sizes are not known, when the number of received ERASUREs is greater than the number of reference ERASURES, wherein the NORMAL RS mode is an FEC mode, and performing FEC in the selected FEC mode.

13 Claims, 4 Drawing Sheets

(56) References Cited

U.S. PATENT DOCUMENTS

| | | | |
|---|---|---|---|
| 7,003,712 B2 * | 2/2006 | Martinian et al. | 714/761 |
| 7,103,824 B2 * | 9/2006 | Halford | 714/759 |
| 7,164,734 B2 * | 1/2007 | Linsky et al. | 375/327 |
| 7,272,777 B2 * | 9/2007 | Hassner et al. | 714/781 |
| 7,322,003 B2 * | 1/2008 | Ishii | 714/769 |
| 7,447,980 B2 * | 11/2008 | Xu et al. | 714/776 |
| 7,555,697 B2 * | 6/2009 | Chang et al. | 714/759 |
| 7,590,921 B1 * | 9/2009 | Goodson | 714/774 |
| 7,734,984 B2 * | 6/2010 | Nee et al. | 714/755 |
| 2007/0033488 A1 * | 2/2007 | Brueggen | 714/763 |
| 2007/0089038 A1 * | 4/2007 | Xu et al. | 714/776 |
| 2008/0301477 A1 * | 12/2008 | Gade et al. | 713/320 |

\* cited by examiner

FIG. 3

| WRONG ERASURE | REAL ERASURE | CRC FAIL | ERASURE ONLY MODE ERROR RATE | | NORMAL RS MODE ERROR RATE | | AUTO ERASURE MODE ERROR RATE | | AUTO ERRATA MODE ERROR RATE | |
|---|---|---|---|---|---|---|---|---|---|---|
| | | | BEFORE MPE-FEC | AFTER MPE-FEC | BEFORE MPE-FEC | AFTER MPE-FEC | BEFORE MPE-FEC | AFTER MPE-FEC | BEFORE MPE-FEC | AFTER MPE-FEC |
| 70 | 10 | 0 | 10 | 10 | 10 | 0 | 10 | 0 | 10 | 0 |
| 30 | 33 | 0 | 33 | 0 | 33 | 33 | 33 | 0 | 33 | 0 |
| 20 | 40 | 0 | 40 | 0 | 40 | 40 | 40 | 0 | 40 | 0 |
| 20 | 40 | 2 | 42 | 42 | 42 | 42 | 42 | 42 | 42 | 0 |

MPE-FEC SYSTEM CAPABLE OF SELECTING AN FEC MODE, A FORWARD ERROR CORRECTING METHOD PERFORMED IN THE MPE-FEC SYSTEM, AND AN FEC MODE SELECTING METHOD PERFORMED IN THE MPE-FEC SYSTEM

BACKGROUND OF THE INVENTION

1. Technical Field

The present disclosure relates to a forward error correcting method in a multi protocol encapsulation-forward error correction (MPE-FEC) system. More particularly, the present invention relates to an MPE-FEC system for selecting an FRC mode, and a forward error correcting method and an FEC mode selecting method performed in the MPE-FEC system.

2. Discussion of the Related Art

Digital video broadcasting-handheld (DVB-H) is a technology standard established in Europe to improve the reception rate of a terrestrial digital television (DTV) in motion. MPE-FEC denotes execution of FEC using ERASURE information. MPE-FEC is performed to improve the performance of reception of DVB-H in motion.

However, when an FEC method is performed in a typical MPE-FEC system, the efficiency of the FEC method is degraded when the received ERASURE information is not valid.

SUMMARY OF THE INVENTION

According to an exemplary embodiment of the present invention, there is provided a forward error correcting method in a multi protocol encapsulation-forward error correction (MPE-FEC) system, in which FEC modes can be selected, the method comprising: comparing the number of received ERASUREs with the number of reference ERASUREs, selecting an ERASURE ONLY mode in which FEC is performed based on information about the locations and sizes of errors, when the number of received ERASUREs is less than the number of reference ERASUREs, wherein the ERASURE ONLY mode is an FEC mode, selecting a NORMAL RS mode in which FEC is performed with respect to errors whose locations and sizes are not known, when the number of received ERASUREs is greater than the number of reference ERASUREs, wherein the NORMAL RS mode is an FEC mode, and performing FEC in the selected FEC mode.

According to an exemplary embodiment of the present invention, there is provided an FEC mode selecting method in an MPE-FEC system, the method comprising: selecting an ERASURE ONLY mode in which FEC is performed based on information about the locations and sizes of errors, when the number of received ERASUREs is less than or equal to the number of reference ERASUREs, wherein the ERASURE ONLY mode is an FEC mode, selecting a NORMAL RS mode in which FEC is performed with respect to errors whose locations and sizes are not known, when the number of received ERASUREs is greater than the number of reference ERASUREs, wherein the NORMAL RS mode is an FEC mode, and selecting an AUTO ERRATA mode when a sum of the number of ERASURE flags and a product of 2 and the number of errors whose locations and sizes are not known is less than or equal to a reference number, wherein the AUTO ERRATA mode is an FEC mode.

According to an exemplary embodiment of the present invention, there is provided an MPE-FEC system for selecting FEC modes, the system comprising an FEC mode setting unit which includes a first comparator comparing the number of received ERASUREs with the number of reference ERASUREs, and an FEC mode selector selecting an ERASURE ONLY mode in which FEC is performed based on information about the locations and sizes of errors, when the number of received ERASUREs is less than or equal to the number of reference ERASUREs, and selecting a NORMAL RS mode in which FEC is performed with respect to errors whose locations and sizes are not known, when the number of received ERASUREs is greater than the number of reference ERASUREs, wherein the ERASURE ONLY mode and the NORMAL RS mode are FEC modes, and a forward error corrector performing FEC in the selected FEC mode.

BRIEF DESCRIPTION OF THE DRAWINGS

The above and other features of the present invention will become more apparent by describing in detailed exemplary embodiments thereof with reference to the attached drawings in which:

FIG. 3 is a table showing the number of errors before FEC and the number of errors after FEC in each FEC mode;

DETAILED DESCRIPTION OF EXEMPLARY EMBODIMENTS

Figure 1:
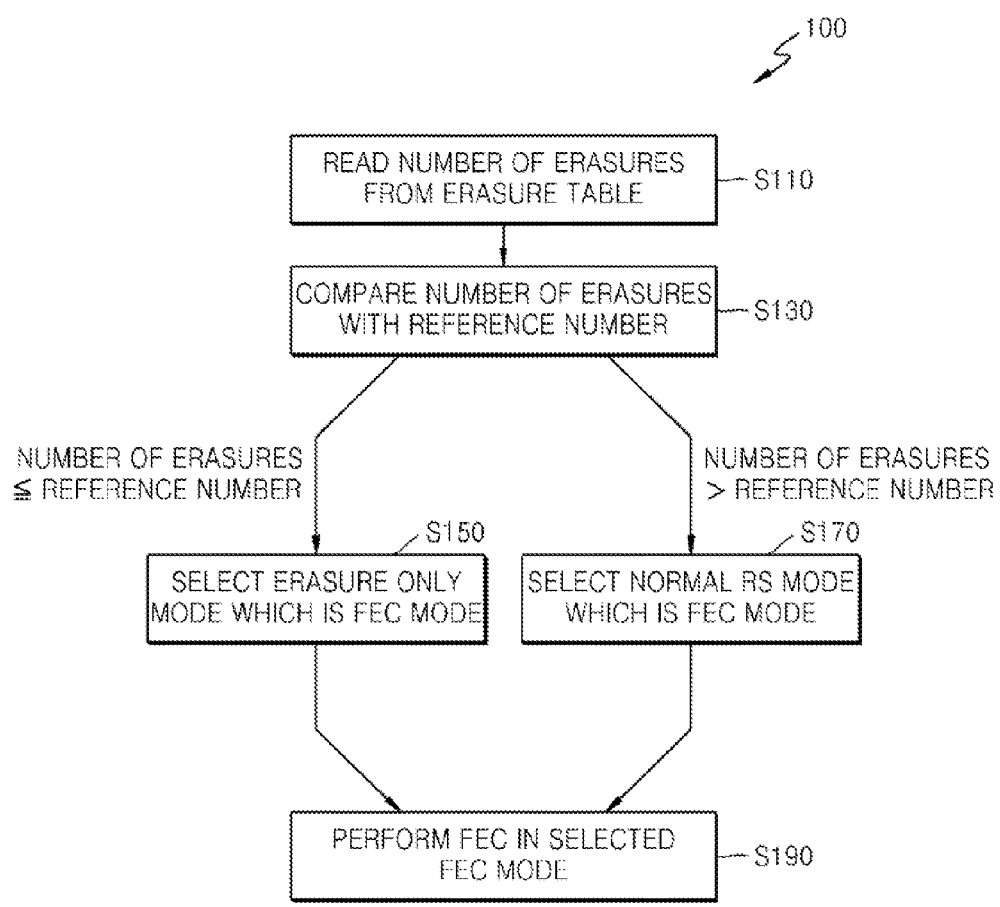
FIG. 1 is a flowchart illustrating operations of selecting an ERASURE ONLY mode and a NORMAL RS mode, among the operations of a forward error correcting method in a multi protocol encapsulation-forward error correction (MPE-FEC) system according to an exemplary embodiment of the present invention.

Hereinafter, exemplary embodiments of the present invention will be described in detail with reference to the accompanying drawings. This invention may, however, be embodied in many different forms and should not be construed as limited to the embodiments set forth herein. Like reference numerals denote like elements in the drawings.

FIG. 1 is a flowchart illustrating operations of selecting an erasure only mode and a normal RS mode, among the operations of a forward error correcting method 100 in a multi protocol encapsulation-forward error correction (MPE-FEC) system according to an exemplary embodiment of the present invention.

Referring to FIG. 1, the forward error correcting method 100 includes a comparing operation S130, an FEC mode selecting operation made up of operations S150 and S170, and an FEC performing operation S190.

In the comparing operation S130, the number of received ERASUREs is compared with the number of reference ERASUREs. When the number of received ERASUREs is less than or equal to the number of reference ERASUREs, an ERASURE ONLY mode is selected, in operation S150. When the number of received ERASUREs is greater than the number of reference ERASUREs, a NORMAL RS mode is selected, in operation S170. The ERASURE ONLY mode denotes an FEC mode in which FEC is performed based on information about the sizes and locations of errors. The NOR- MAL RS mode denotes an FEC mode in which FEC is performed with respect to errors whose locations and sizes are not known. In the FEC performing operation S190, FEC is performed in the selected FEC mode.

The forward error correcting method 100 may further include an operation S110 for reading ERASURE information. In operation S110, ERASURE information including the number of ERASUREs is read out from an ERASURE table.

In the forward error correcting method 100, when the number of received ERASUREs is less than or equal to a reference number N, the ERASURE ONLY mode is selected. Wren the number of received ERASUREs is greater the reference number N, the NORMAL RS mode is selected. As an example, N may be the integer 64. In an alternate embodiment of the forward error correcting method 100, when the number of received ERASURES is less than the reference number N, the ERASURE ONLY mode is selected and when the number of received ERASURES is greater than or equal to the reference number N, the ERASURE ONLY mode is selected. The NORMAL RS mode may be an FEC mode in which at most M errors whose locations and sizes are not known are subject to FEC. In the FEC performing operation S190, when FEC is performed in the NORMAL RS mode, the at most. M errors whose locations and sizes are not known can be corrected. As an example, M may be equal to the integer 32.

Figure 2:
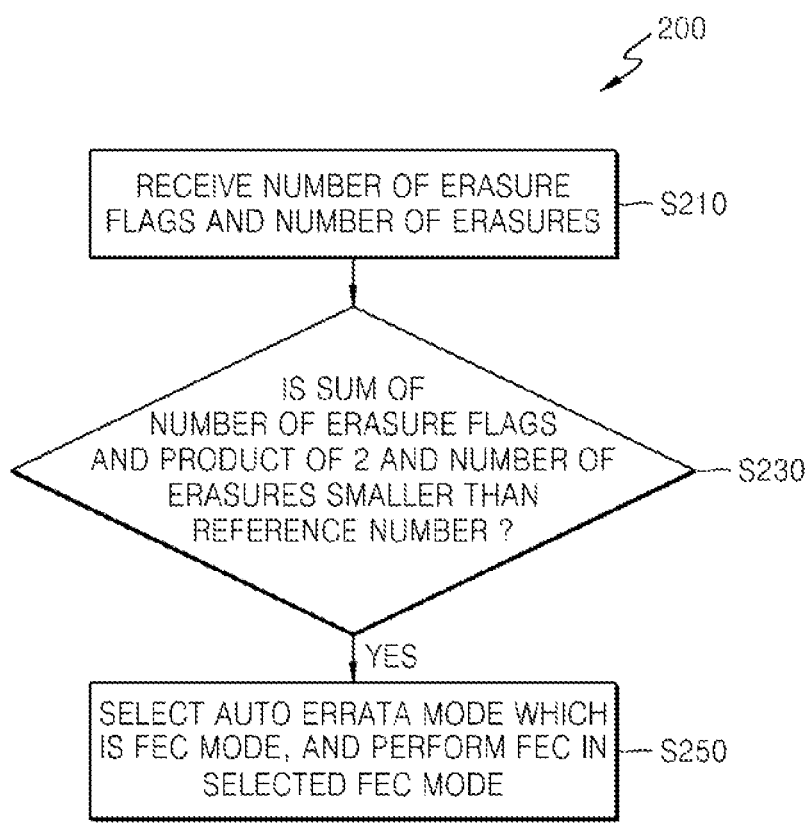
FIG. 2 is a flowchart illustrating an operation of selecting an AUTO ERRATA mode and a normal RS mode, among the operations of the forward error correcting method illustrated in FIG. 1, according to an exemplary embodiment of the present invention.

FIG. 2 is a flowchart illustrating an operation of selecting an AUTO ERRATA mode, among the operations of the forward error correcting method 100, according to an exemplary embodiment of the present invention.

The AUTO ERRATA mode may be an FEC mode in which, when an error is generated but no ERASURE flags are produced, the error is subject to FEC. A forward error corrector 480 (shown in FIG. 4) performs FEC by referring to an ERASURE flag obtained by a CRC test. Even when a CRC test fails and a real error is generated, an ERASURE flag may not be produced. When this happens, the forward error corrector 480 may incorrectly assume that all errors have been corrected. The AUTO ERRATA mode can be used to correct errors when the ERASURE flag has not been set properly.

The forward error correcting method 100 may further include an operation S250 for selecting the AUTO ERRATA mode. In the operation S250, the AUTO ERRATA mode is selected in response to the number of ERASURE flags obtained through the CRC test and the number of errors whose locations and sizes are not known.

When a sum of the number of ERASURE flags and a product of 2 and the number of errors whose locations and sizes are not known is less than a reference number N, the AUTO ERRATA mode can be selected. For example, when the sum of the number of ERASURE flags and the product of 2 and the number of errors whose locations and sizes are not known is less than a reference number 65, the AUTO ERRATA mode can be selected.

FIG. 3 is a table showing the number of errors before FEC and the number of errors after FEC in each FEC mode where a reference number of 64 is used. Referring to FIG. 3, the fourth row from the bottom illustrates an example here the total number of ERASUREs is 80. Because the number of ERASUREs is greater than 64, the forward error correction method 100 is performed in the NORMAL RS mode. As a result, 10 errors whose locations and sizes are not known are corrected.

The third row from the bottom illustrates an example where the total number of ERASUREs is 63. Because the number of ERASUREs is less than 64, the forward error correction method 100 is performed in the ERASURE ONLY mode. As a result, 33 errors are corrected.

The second row from the bottom illustrates an example where the total number of ERASUREs is 60. Because the number of ERASUREs is less than 64, the forward error correction method 100 is performed in the ERASURE ONLY mode. As a result, 40 errors are corrected.

The last row of the table illustrates an example where a CRC test fails. When this happens, the forward error correction method 100 is performed in the AUTO ERRATA mode. As a result, 42 errors are corrected.

An FEC mode selecting method in an MPE-FEC system according to an exemplary embodiment of the present invention includes an operation of selecting an ERASURE ONLY mode or a NORMAL RS mode and an operation of selecting an AUTO ERRATA mode.

In the operation of selecting an ERASURE ONLY mode or a NORMAL RS mode, when the number of received ERASUREs is less than the number of reference ERASUREs, the ERASURE ONLY mode in which FEC is performed based on information about the sizes and locations of errors is selected. When the number of received ERASUREs is greater than or equal to the number of reference ERASUREs, the NORMAL RS mode in which errors whose locations and sizes are not known are subject to FEC is selected. In the operation of selecting an AUTO ERRATA mode, when a sum of the number of ERASURE flags and a product of 2 and the number of errors whose locations and sizes are not known is less than a reference number, the AUTO ERRATA mode is selected.

The FEC mode selecting method has the same technical spirit and construction as those of the FEC mode selecting operations S150 and S170 and the AUTO ERRATA mode selecting operation S250 included in the forward error correcting method 100. Hence, the FEC mode selecting method can be easily understood from the description of the forward error correcting method 100, so a detailed description thereof is not necessary.

Figure 4:
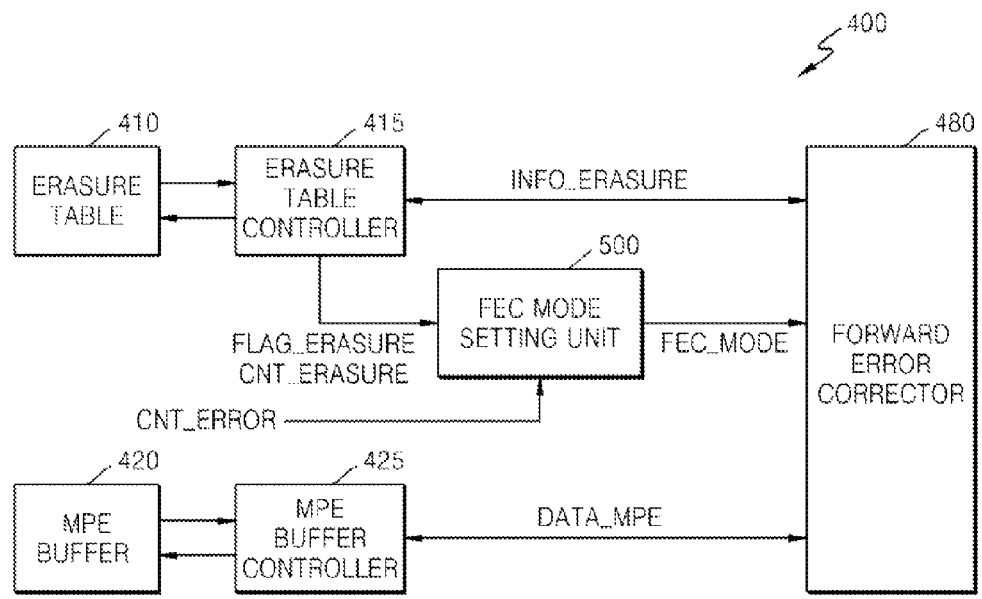
FIG. 4 is a block diagram of an MPE-FEC system according to an exemplary embodiment of the present invention.
Figure 5:
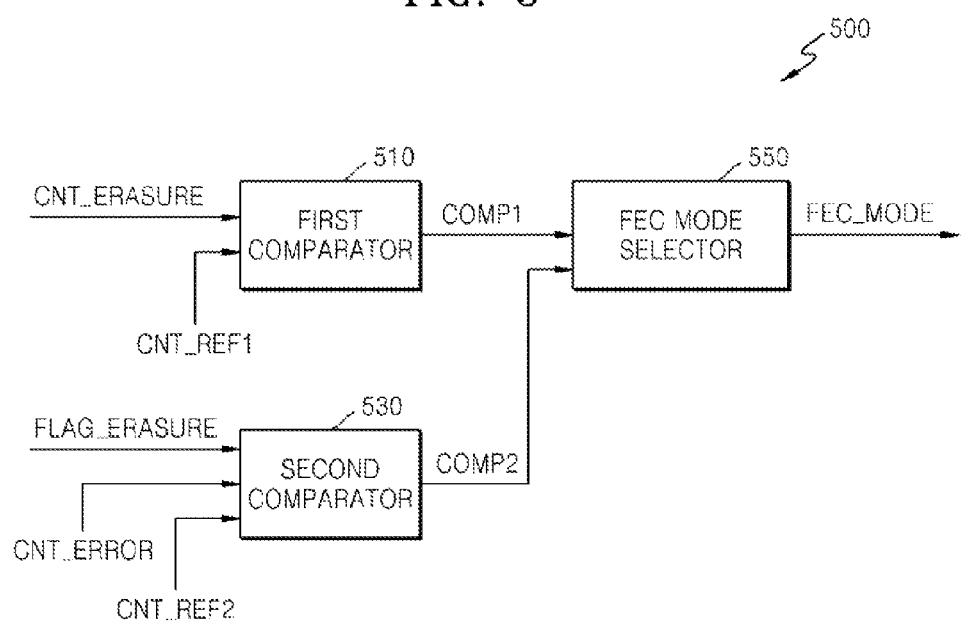
FIG. 5 is a block diagram of an FEC mode setting unit illustrated in FIG. 4, according to an exemplary embodiment of the present invention.

FIG. 4 is a block diagram of an MPE-FEC system 400 according to an exemplary embodiment of the present invention, in which an FEC mode can be selected. FIG. 5 is a block diagram of an FEC mode setting unit 500 illustrated in FIG. 4, according to an exemplary embodiment of the present invention.

Referring to FIG. 4, the MPE-FEC system 400 includes the FEC mode setting unit 500 and the forward or corrector 480.

Referring to FIG. 5, the FEC mode setting unit 500 includes a first comparator 510 and an FEC mode selector 550.

The first comparator 510 compares the number of received ERASUREs, CNT_ERASURE, with the reference number of ERASUREs CNT_REF1. When the received number of ERASUREs CNT_ERASURE is less than or equal to the reference number of ERASUREs CNT_REF1, the FEC mode selector 550 selects the ERASURE ONLY mode. When the received number of ERASUREs CNT_ERASURE is greater than the reference number of ERASUREs CNT_REF1, the FEC mode selector 550 selects the NORMAL RS mode.

The forward error corrector 480 performs FEC in a selected FEC mode FEC_MODE.

The MPE-FEC system 400 may further include an ERASURE table 410 that includes info nation about ERASUREs INFO_ERASURE. The first comparator 510 may compare the received number of ERASUREs CNT_ERASURE and the reference number of ERASUREs CNT_REF1 that are included in the ERASURE information INFO_ERASURE read out from the ERASURE table 410. The MPE-FEC system 400 may further include an ERASURE table controller 415. The ERASURE table controller 415 reads out the ERASURE information INFO_ERASURE from the ERASURE table 410.

The FEC mode selector 550 can select the AUTO ERRATA mode in response to the number of ERASURE flags FLAG_ERASURE obtained through the CRC test and the number of errors whose locations and sizes are not known, CNT_ERROR.

The FEC mode setting unit 500 may further include a second comparator 530. The second comparator 530 compares a sum of the ERASURE flags FLAG_ERASURE and a product of 2 and the error number CNT_ERROR with a reference number CNT_REF2. When the sum of the ERASURE flags FLAG_ERASURE and the product of 2 and the error number CNT_ERROR is less than the reference number CNT_REF2, the FEC mode selector 550 can select the AUTO ERRATA mode. For example, when the sum of the ERASURE flags FLAG_ERASURE and the product of 2 and the error number CNT_ERROR is less than 65, the FEC mode selector 550 selects the AUTO ERRATA mode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A forward error correcting method in a multi protocol encapsulation-forward error correction (MPE-FEC) system, in which FEC modes are selected, the method comprising:
    a first comparator receiving a count of received ERASUREs and a first reference count to output a first comparison value indicating an ERASURE ONLY mode when the count of ERASUREs is less than or equal to the first reference count and a NORMAL RS mode otherwise;
    a second comparator receiving a number of ERASURE flags obtained from a CRC test, a count of errors whose locations and sizes are not known, and a second reference count to output a second comparison value indicating whether an AUTO ERRATA mode is available;
    a selector, receiving the first and second comparison values, selecting the AUTO ERRATA mode when the second comparison value indicates the AUTO ERRATA mode is available, selecting the ERASURE ONLY mode when the second comparison value indicates the AUTO ERRATA mode is not available and the first comparison value indicates the ERASURE ONLY mode, and selecting the NORMAL RS mode when the second comparison value indicates the AUTO ERRATA mode is not available and the first comparison value indicates the NORMAL RS mode; and
    performing FEC in the selected mode,
        wherein the ERASURE ONLY mode is a mode in which FEC is performed based on information about locations and sizes of errors by referring to the ERASURE flags obtained by the CRC test,
        wherein the NORMAL RS mode is a mode in which FEC is performed with respect to errors whose locations and sizes are not known by referring to the ERASURE flags, and
        wherein the AUTO ERRATA mode is a mode in which FEC is performed with respect to errors whose locations and sizes are not known by not referring to the ERASURE flags.

2. The forward error correcting method of claim 1, further comprising reading ERASURE information including the count of received ERASUREs from an ERASURE table.

3. The forward error correcting method of claim 1, wherein the first reference count is 64 reference ERASUREs.

4. The forward error correcting method of claim 1, wherein the NORMAL RS mode is an FEC mode in which FEC is performed with respect to at most 32 errors whose locations and sizes are not known.

5. The forward error correcting method of claim 1, wherein when a sum of the number of ERASURE flags and a product of 2 and the count of errors is less than a number of reference ERASUREs, the AUTO ERRATA mode is selected.

6. The forward error correcting method of claim 5, wherein when the sum of the count of ERASURE flags and the product of 2 and the count of errors is less than 65, the AUTO ERRATA mode is selected.

7. An FEC mode selecting method in an MPE-FEC system, the method comprising:
    a first comparator receiving a count of received ERASUREs and a first reference count to output a first comparison value indicating an ERASURE ONLY mode when the count of ERASUREs is less than or equal to the first reference count and a NORMAL RS mode otherwise;
    a second comparator receiving a number of ERASURE flags obtained from a CRC test, a count of errors whose locations and sizes are not known, and a second reference count to output a second comparison value indicating whether an AUTO ERRATA mode is available; and
    a selector, receiving the first and second comparison values, selecting the AUTO ERRATA mode when the second comparison value indicates the AUTO ERRATA mode is available, selecting the ERASURE ONLY mode when the second comparison value indicates the AUTO ERRATA mode is not available and the first comparison value indicates the ERASURE ONLY mode, and selecting the NORMAL RS mode when the second comparison value indicates the AUTO ERRATA mode is not available and the first comparison value indicates the NORMAL RS mode,
        wherein the ERASURE ONLY mode is an FEC mode in which FEC is performed based on information about locations and sizes of errors by referring to the ERASURE flags obtained by the CRC test,
        wherein the NORMAL RS mode is an FEC mode in which FEC is performed with respect to errors whose locations and sizes are not known by referring to the ERASURE flags, and
        wherein the AUTO ERRATA mode is an FEC mode in which FEC is performed with respect to errors whose locations and sizes are not known without referring to the ERASURE flags.

8. An MPE-FEC system for selecting FEC modes, the system comprising:
    an FEC mode setting unit comprising:
    a first comparator comparing a count of received ERASUREs with a first reference count to output a first comparison value indicating an ERASURE ONLY mode when the count of ERASURES is less than or equal the first reference count and a NORMAL RS mode otherwise;
    a second comparator receiving a number of ERASURE flags obtained from a CRC test, a count of errors whose locations and sizes are not known, and a second reference count to output a second comparison value indicating whether an AUTO ERRATA mode is available; and an FEC mode selector, receiving the first and second comparison values, selecting the AUTO ERRATA mode when the second comparison value indicates the AUTO ERRATA mode is available, selecting the ERASURE ONLY mode when the second comparison value indicates the AUTO ERRATA mode is not available and the first comparison value indicates the ERASURE ONLY mode, and selecting the NORMAL RS mode when the second comparison value indicates the AUTO ERRATA mode is not available and the first comparison value indicates the NORMAL RS mode, wherein the ERASURE ONLY mode is a mode in which FEC is performed based on information about locations and sizes of errors by referring to the ERASURE flags obtained by a CRC test, and wherein the NORMAL RS mode is a mode in which FEC is performed with respect to errors whose locations and sizes are not known by referring to the ERASURE flags, and wherein the AUTO_ERRATA mode is an FEC mode in which FEC is performed with respect to errors whose locations and sizes are not known without referring to the ERASURE flags; and a forward error corrector performing FEC in the selected FEC mode.

9. The MPE-FEC system of claim 8, further comprising an ERASURE table including ERASURE information.

10. The MPE-FEC system of claim 9, further comprising an ERASURE table controller reading out the ERASURE information from the ERASURE table.

11. The MPE-FEC system of claim 8, wherein the first reference count is 64 reference ERASUREs.

12. The MPE-FEC system of claim 8, wherein the NORMAL RS mode is an FEC mode in which FEC is performed with respect to at most 32 errors whose locations and sizes are not known.

13. The MPE-FEC system of claim 8, wherein the FEC mode selector selects the AUTO ERRATA mode when a sum of the count of ERASURE flags and a product of 2 and the count of errors is less than 65.

* * * * *